US008503223B2

(12) United States Patent
Shuto

(10) Patent No.: US 8,503,223 B2
(45) Date of Patent: Aug. 6, 2013

(54) SEMICONDUCTOR STORAGE DEVICE

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,163

(22) Filed: Mar. 19, 2012

(65) Prior Publication Data
US 2012/0314494 A1 Dec. 13, 2012

(30) Foreign Application Priority Data
Jun. 8, 2011 (JP) .................. 2011-128420

(51) Int. Cl.
G11C 11/00 (2006.01)
(52) U.S. Cl.
USPC ........... 365/158; 365/148; 365/171; 977/933; 977/935
(58) Field of Classification Search
USPC .......... 365/48, 55, 62, 66, 74, 78, 80–93, 365/100, 130, 131, 148, 158, 171–173, 209, 365/213, 225.5, 230.07, 232, 243.5; 216/22; 257/421, E21.665; 438/3; 428/810–816, 817–825.1, 826; 977/933–935
See application file for complete search history.

(56) References Cited

U.S. PATENT DOCUMENTS

| 7,286,394 B2 * | 10/2007 | Ooishi ........................ 365/158 |
| 7,751,235 B2 * | 7/2010 | Hosotani et al. ............. 365/173 |
| 2006/0077737 A1 * | 4/2006 | Ooishi ........................ 365/203 |
| 2007/0279963 A1 | 12/2007 | Tsuchida et al. |
| 2008/0013358 A1 * | 1/2008 | Ooishi ........................ 365/63 |
| 2008/0151608 A1 * | 6/2008 | Hosotani et al. ............. 365/158 |
| 2010/0002492 A1 | 1/2010 | Kajiyama |
| 2010/0238707 A1 * | 9/2010 | Tsuchida ...................... 365/148 |

FOREIGN PATENT DOCUMENTS

| JP | 2007-317795 | 12/2007 |
| JP | 2010-16193 | 1/2010 |

OTHER PUBLICATIONS

Tsuchida et al., A 64Mb MRAM with Clamped-Reference and Adequate-Reference Schemes, 2010 IEEE International Solid-State Circuits Conference Digest of Technical Papers, 2010, pp. 258-259.

* cited by examiner

Primary Examiner — Harry W Byrne
(74) Attorney, Agent, or Firm — Knobbe, Martens, Olson & Bear, LLP

(57) ABSTRACT

In a memory, the MTJ elements respectively have a first end electrically connected to any one of a source and a drain of one of the cell transistors. First bit lines each of which is electrically connected to the other one of the source and the drain of one of the cell transistors. Second bit lines each of which is electrically connected to a second end of one of the MTJ elements. Word lines each of which is electrically connected to a gate of one of the cell transistors or functions as a gate of one of the cell transistors. A plurality of the second bit lines correspond to one of the first bit lines. A plurality of the MTJ elements share the same word line and the same active area. The active area is continuously formed in an extending direction of the first and second bit lines.

18 Claims, 6 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2011-128420, filed on Jun. 8, 2011, the entire contents of which are incorporated herein by reference.

FIELD

The embodiments of the present invention relate to a semiconductor device and manufacturing method thereof.

BACKGROUND

A magnetic random access memory (MRAM) is a type of a resistance change memories. As techniques for writing data to an MRAM, there have been known magnetic field writing and spin-transfer torque writing. Among these techniques, the spin-transfer torque writing has advantages in higher integration, lower power consumption, and higher performance because of the property of a spin-transfer torque device that a spin injection current is smaller in an amount necessary for magnetization reversal as magnetic bodies, become smaller in size.

Conventionally, a plurality of magnetic tunnel junction (MTJ) elements that share word lines are arranged respectively on different active areas and cell transistors are provided on both sides of each of the MTJ elements. When a certain MTJ element is accessed, two cell transistors provided on both sides of the MTJ element become conductive and then a current flows to the MTJ element. Because the gate width of one cell transistor is 2F (F is a Feature Size), the total of the gate widths of the two cell transistors is 4F. Furthermore, the size of a memory cell is $12F^2$.

In order to write data to MTJ elements of the spin-transfer torque writing, a current larger than an inversion threshold current has to be supplied to the MTJ elements. In order to supply a current that is sufficiently higher than the inversion threshold current to the MTJ elements, a further increase of the gate width of the cell transistor has been desired.

Furthermore, in order to increase the gate width of the cell transistor, an active area having a large area is required; however, in manufacturing, it is difficult to separate the active area having a large area by small STIs (Shallow Trench Isolations).

DETAILED DESCRIPTION

A semiconductor storage device according to the present embodiment includes a semiconductor substrate and an active area on the semiconductor substrate. Cell transistors are formed on the active area. Magnetic tunnel junction elements respectively have a first end electrically connected to any one of a source and a drain of one of the cell transistors. First bit lines each of which is electrically connected to the other one of the source and the drain of one of the cell transistors. Second bit lines each of which is electrically connected to a second end of one of the magnetic tunnel junction elements. Word lines each of which is electrically connected to a gate of one of the cell transistors or functions as a gate of one of the cell transistors. A plurality of the second bit lines correspond to one of the first bit lines. A plurality of the magnetic tunnel junction elements share the same word line and the same active area. The active area is continuously formed in an extending direction of the first and second bit lines.

Embodiments will now be explained with reference to the accompanying drawings. The present invention is not limited to the embodiments.

First Embodiment

Figure 1:
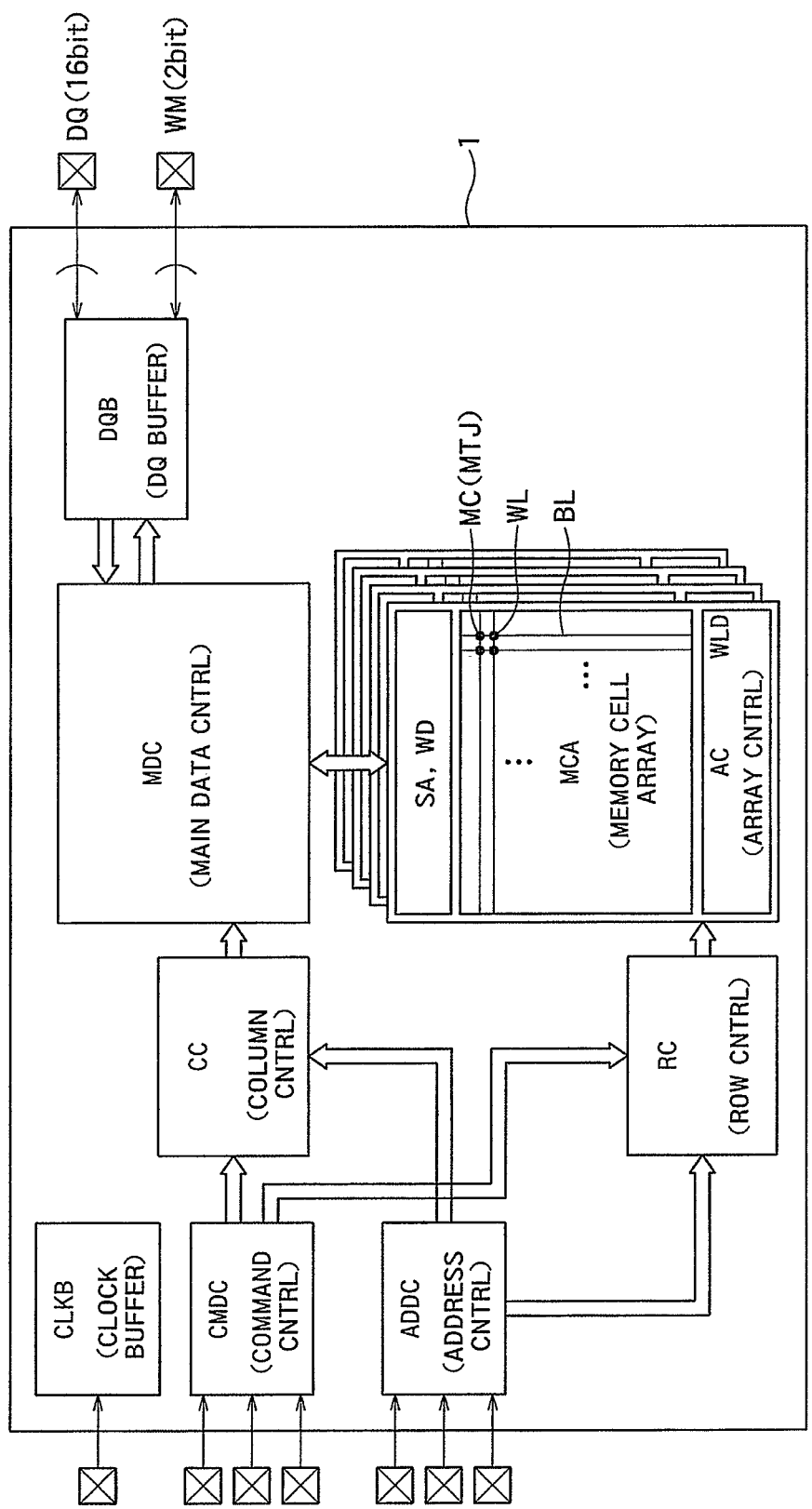
FIG. 1 is a block diagram showing a memory chip 1 of a magnetic random access memory according to a first embodiment.

FIG. 1 is a block diagram showing a memory chip 1 of a magnetic random access memory (hereinafter, "MRAM") according to a first embodiment. The first embodiment is also applicable to memories (a PCRAM and an RRAM, for example) using resistance change elements other than the MRAM.

The MRAM according to the first embodiment includes memory cell arrays MCA, sense amplifiers SA, write drivers WD, a main data controller MDC, a DQ buffer DQB, a column controller CC, a row controller RC, a clock buffer CLKB, a command controller CMDC, an address controller ADDC, array controllers AC, and word line drivers WLD.

Each of the memory cell arrays MCA includes a plurality of memory cells MC arranged two-dimensionally in a matrix. The memory cells MC are arranged to correspond to intersections between bit lines BL (or pairs of bit lines BL) and word lines WL, respectively. The bit lines BL extend in a column direction. The word lines WL extend in a row direction orthogonal to the column direction.

Each of the sense amplifiers SA is connected to the memory cells MC via the corresponding bit line BL, and configured to detect data stored in the memory cells MC. Each of the write drivers WD is connected to the memory cells MC via the corresponding bit line BL, and configured to write data to the memory cells MC.

The main data controller MDC transfers data received from the DQ buffer DQB to one of the write drivers WD so as to write data to the memory cells MC in a desired column under control of the column controller CC, or transfers data read from the memory cells MC in the desired column to the DQ buffer DQB under control of the column controller CC. Furthermore, the main data controller MDC is configured to inhibit data writing in response to write mask data WM or a write inhibit area address WOADD, as described later.

The DQ buffer DQB temporarily holds read data via a DQ pad DQ and outputs the read data to outside of the memory chip 1. Alternatively, the DQ buffer DQB receives write data via the DQ pad DQ from outside of the memory chip 1 and temporarily holds the write data.

The column controller CC controls one of the sense amplifiers SA or one of the write drivers WD to operate so that the sense amplifier SA or write driver WD selectively drives one bit line BL in the desired column in response to a column address.

The row controller RC controls one of the word line drivers WLD to operate so that the word line driver WLD selectively drives a desired word line WL in response to a row address.

A clock-signal-determining operation timing of the entire memory chip 1 is input to the clock buffer CLKB.

The command controller CMDC receives commands indicating various operations such as a data reading operation and a data writing operation, and controls the column controller CC and the row controller RC in response to those commands.

The address controller ADDC receives the row address and the column address, decodes these addresses, and transmits the decoded row and column addresses to the column controller CC and the row controller RC, respectively.

Each of the array controllers AC controls entirety of the corresponding memory cell array MCA.

Figure 2:
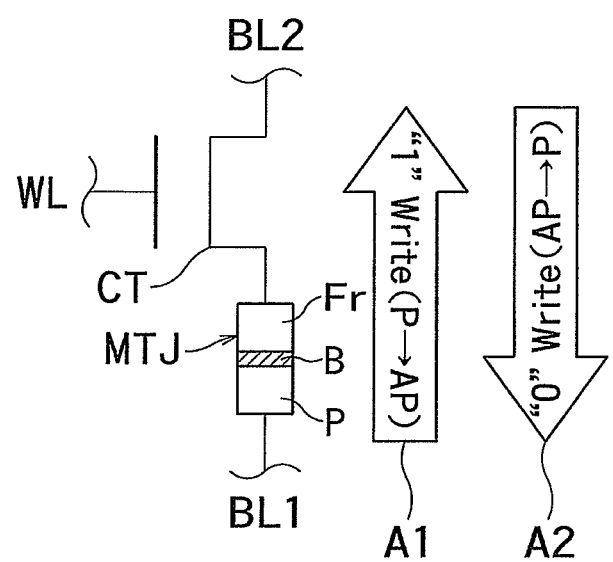
FIG. 2 is an explanatory diagram showing a configuration of a single memory cell MC.

FIG. 2 is an explanatory diagram showing a configuration of a single memory cell MC. Each memory cell MC includes a magnetic tunnel junction (MTJ) element and a cell transistor CT. The MTJ element and the cell transistor CT are connected in series between one bit line BL and a source line SL. In the memory cell MC, the cell transistor CT is arranged near the bit line BL and the MTJ element is arranged near the source line SL. A gate of the cell transistor CT is connected to one word line WL.

The MTJ element that uses the TMR (tunneling magnetoresistive) effect has a stacked structure in which a nonmagnetic layer (tunnel dielectric film) is sandwiched between two ferromagnetic layers. The MTJ element stores therein digital data by a change in a magnetic resistance due to the spin-polarized tunneling. The MTJ element can be set in a low resistance state or a high resistance state depending on magnetization orientations of the two ferromagnetic layers. For example, when it is defined that the low resistance state indicates data "0" and that the high resistance state indicates data "1", one-bit data can be recorded in the MTJ element. Needless to say, it can be defined that the low resistance state indicates data "1" and that the high resistance state indicates data "0". For example, the MTJ element is configured to sequentially stack a pinned layer P, a tunnel barrier layer B, and a recording layer Fr. The pinned layer P and the recording layer Fr are made of a ferromagnetic body and the tunnel barrier layer B is an insulating film. The pinned layer P has a fixed magnetization orientation, and the recording layer Fr has a variable magnetization orientation. The MTJ element stores data depending on the magnetization orientation of the recording layer Fr.

During the data writing operation, when a current equal to or higher than an inversion threshold current flows to the MD element in an arrow A1 direction, the magnetization orientation of the recording layer Fr becomes anti-parallel to that of the pinned layer P. The MTJ element thereby turns into the high resistance state (data "1"). During the data writing operation, when the current equal to or higher than the inversion threshold current flows to the MTJ element in an arrow A2 direction, the magnetization orientation of the recording layer Fr becomes parallel to that of the pinned layer P. The MTJ element thereby turns into the low resistance state (data "0"). In this way, different data can be written to the MTJ element depending on a current flow direction.

Figure 3:
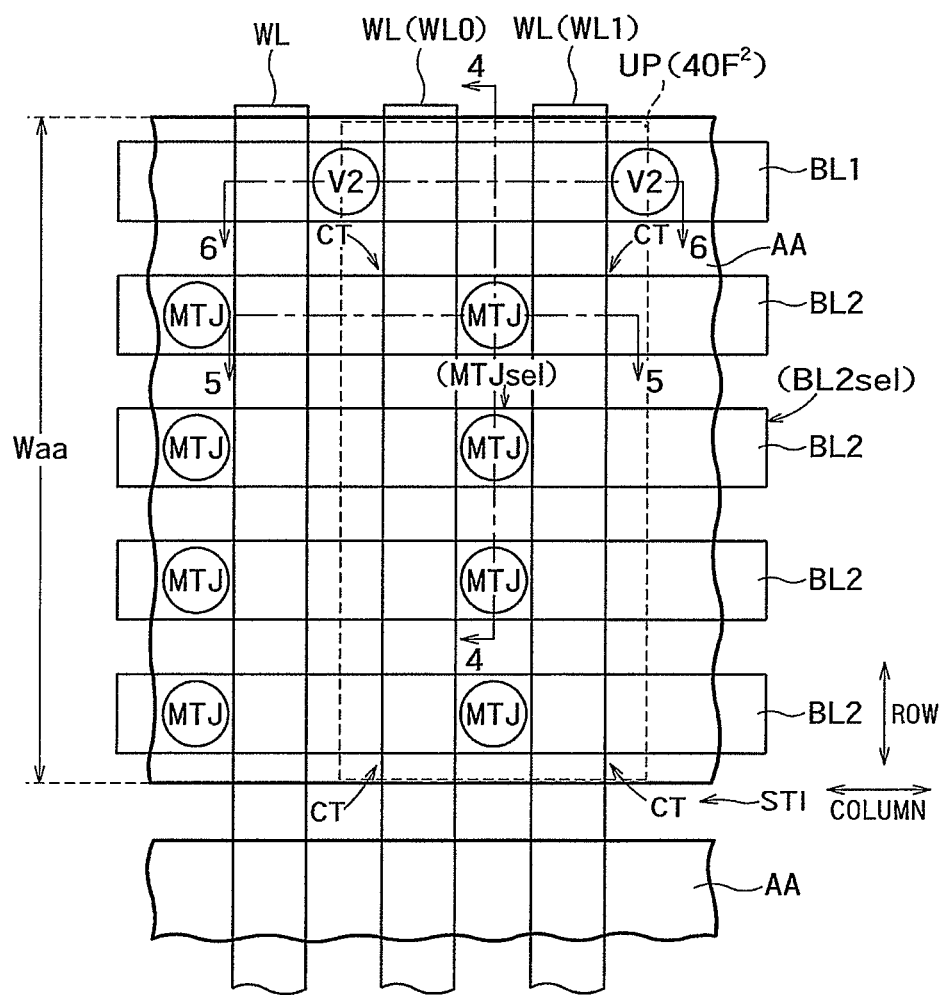
FIG. 3 is a partial plan layout view of each of the memory cell arrays MCA in the MRAM according to the first embodiment.
Figure 4:
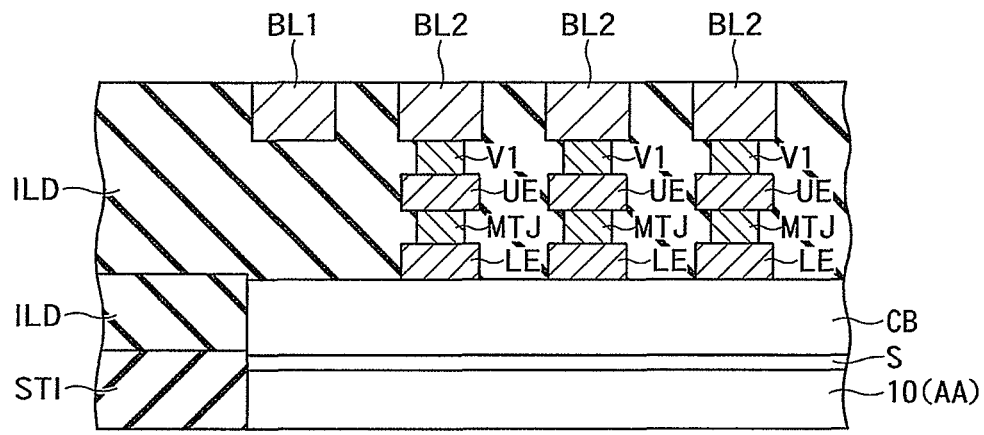
FIG. 4 is a cross-sectional view taken along a line 4-4 of FIG. 3.
Figure 5:
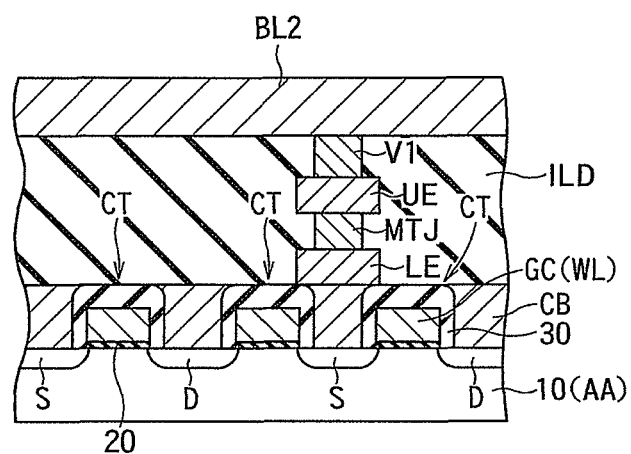
FIG. 5 is a cross-sectional view taken along a line 5-5 of FIG. 3.
Figure 6:
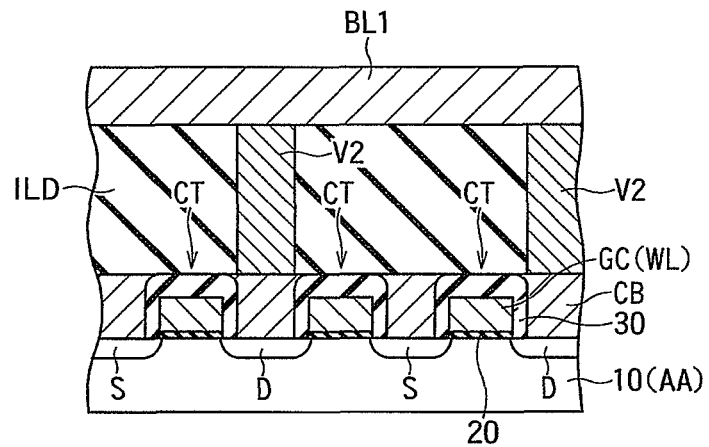
FIG. 6 is a cross-sectional view taken along a line 6-6 of FIG. 3.

FIG. 3 is a partial plan layout view of each of the memory cell arrays MCA in the MRAM according to the first embodiment. FIG. 4 is a cross-sectional view taken along a line 4-4 of FIG. 3. FIG. 5 is a cross-sectional view taken along a line 5-5 of FIG. 3. FIG. 6 is a cross-sectional view taken along a line 6-6 of FIG. 3.

As shown in FIG. 3, in the MRAM according to the first embodiment, a first bit line BL1 and second bit lines BL2 extend in the column direction and the word lines WL extend in the row direction substantially orthogonal to the column direction. The first bit line BL1 is electrically connected to each cell transistor CT via a via contact V2. Each of the second bit lines BL2 is electrically connected to an upper end of each MTJ element. A plurality of second bit lines BL2 corresponding to a plurality of MTJ elements arranged in the row direction are provided to correspond to one first bit line BL1 and share the first bit line BL1.

In a plan layout, a plurality of MTJ elements are provided between the two adjacent word lines WL. The MD elements provided between the two adjacent word lines WL share the two word lines WL. The two word lines WL function as gate electrodes GC of the cell transistors CT, and become conductive when one of the MTJ elements between the two word lines WL is selected.

An active area AA continuously extends in the column direction in each memory cell array MCA. Therefore, the MTJ elements arranged in the column direction share the active area AA. The active area AA is separated into a plurality of areas by element isolation regions STI (Shallow Trench Isolation) in the row direction.

As shown in FIGS. 5 and 6, the MRAM according to the first embodiment includes a silicon substrate 10 serving as a semiconductor substrate and the active areas AA formed on the silicon substrate 10. Each of the cell transistors CT formed on the active areas AA includes a source layer S, a drain layer D, and the gate electrode GC. The gate electrode GC is isolated from the silicon substrate 10 by a gate dielectric film 20, and isolated from a contact plug CB by an insulating film 30.

As shown in FIG. 5, the contact plug CB is provided on the source layer S of each cell transistor CT. A lower electrode LE is provided on the contact plug CB, and one MTJ element is provided on the lower electrode LE. The source layer S of the cell transistor CT is thereby electrically connected to a lower end of the MTJ element via the contact plug CB and the lower electrode LE. Furthermore, an upper electrode UE is provided on the MTJ element, and a via contact V1 is provided on the upper electrode UE. The second bit line BL2 is provided on the via contact V1. The upper end of the MTJ element is thereby connected to the second bit line BL2 via the upper electrode UE and the via contact V1.

On the other hand, as shown in FIG. 6, another contact plug CB is provided on the drain layer D of each cell transistor CT. The via contact V2 is provided on the contact plug CB. The drain layer D of the cell transistor CT is thereby electrically connected to the first bit line BL1 via the contact plug CB and the via contact V2.

In this way, as shown in FIGS. 5 and 6, the source layer S of each cell transistor CT is electrically connected to the lower end of the MTJ element and the drain layer D thereof is electrically connected to the first bit line BL1. The upper end of the MTJ element is electrically connected to the second bit line BL2. The MTJ element and the cell transistor CT are thereby connected in series between the first bit line BL1 and the second bit line BL2.

As shown in FIG. 4, the lower ends of the MTJ elements adjacent in the row direction are electrically short-circuited to one another by the contact plug CB extending in the row direction. The source layer S of each cell transistor CT is formed under and along the contact plug CB. With this configuration, under each of the two word lines WL on both sides of the MTJ elements shown in FIG. 3, the cell transistor CT having a large channel width and extending in the row direction is provided. In other words, a plurality of cell transistors CT connected to a plurality of MTJ elements sharing one word line WL and one active area AA are connected in parallel in a gate width direction. Preferably, the contact plugs CB are formed out of a low resistance metal (Cu or W, for example) so as to reduce a resistance difference between both ends of each cell transistor CT in the gate width direction.

The MTJ elements provided between the two adjacent word lines WL shown in FIG. 3 share the two word lines WL provided on the both sides of the MTJ elements and the same active area. Therefore, the upper ends of the MTJ elements are connected to the different second bit lines BL2, respectively, but the lower ends thereof are commonly connected to the two cell transistors CT provided on the both sides of the MTJ elements.

While the source layer S and the drain layer D of each cell transistor CT are named as they are for the sake of convenience, the positional relation between the source layer S and the drain layer D is often reversed depending on the current flow direction. Furthermore, the gate electrode GC of each cell transistor CT can function as the word line WL per se. Alternatively, however, the word lines WL can be provided in a different layer from a layer in which the gate electrode GC is provided. In this case, the gate electrode GC is electrically connected to one of the word lines WL via a contact (not shown).

As described above, in the MRAM according to the first embodiment, a plurality of MTJ elements are provided between the two adjacent word lines WL and share the two word lines WL. The cell transistors CT corresponding to the two word lines WL are provided on the same active area AA and commonly connected to the MTJ elements provided between the two word lines WL. The cell transistors CT corresponding to one of the two word lines WL are connected in series or one cell transistor CT having a large gate width and corresponding to one of the two word lines WL is provided. Likewise, the cell transistors CT corresponding to the other word line WL are connected in series or one cell transistor having the large gate width and corresponding to the other word line WL is provided. Descriptions are given below, while assuming that the cell transistors having the large gate width are provided to correspond to the two word lines WL, respectively. In the MRAM according to the first embodiment configured as described above, the cell transistors CT each having the large gate width can be provided on the both sides of the MTJ elements, respectively. That is, the MTJ elements provided between the two word lines WL are connected not to the individual cell transistors CT, respectively but to the common cell transistors CT each having the large gate width. The gate width of each of the cell transistors CT corresponding to the two adjacent word lines WL, respectively is substantially equal to a width Waa of one active area AA in the row direction. Therefore, the cell transistors CT can supply a sufficiently high current to one MTJ element selected from the MTJ elements provided between the two word lines WL.

Further, in an example shown in FIG. 3, the four second bit lines BL2 commonly use one first bit line BL1 and the cell transistors CT corresponding to the four MTJ elements provided between the two word lines WL are shared by the four MTJ elements. Accordingly, an area of a unit pattern UP indicated by a broken line in FIG. 3 is $40F^2$. The unit pattern UP is a pattern representing one unit of the plan layout, and the plan layout of the memory cell array MCA is formed by repeating this unit pattern UP in a plane of the silicon substrate 10. Note that F (Feature Size) is a minimum feature size using lithography and etching. Because one unit pattern UP includes the four MTJ elements, an area of one MTJ element is $10F^2$. Furthermore, the gate width of each cell transistor CT is equal to the width Waa of one active area AA in the row direction, that is, 10F. Because the cell transistors CT are provided on the respective both sides of the MTJ elements, the gate widths of the two cell transistors CT are 20F in total.

Generally, in a conventional MRAM, the area of each memory cell is $12F^2$ and the gate width of the cell transistor per one memory cell MC is 4F.

Therefore, the area of one MTJ element (or one memory cell MC) of the MRAM according to the first embodiment can be reduced and the gate width of the cell transistor CT per one MTJ element (or one memory cell MC) can be increased.

As a result, even when a current necessary to write data is high, it is possible to supply a current sufficient to write data to each MTJ element in the MRAM according to the first embodiment. Furthermore, even when the current necessary to write data is low, it is possible to stably write data at a high current.

In the first embodiment, the number of MTJ elements that share the two adjacent word lines WL and one active area AA is four. Alternatively, the number of MTJ elements can be increased. In this case, it suffices to increase the width Waa of the active area AA in the row direction. Even when the number of MTJ elements that share the two adjacent word lines WL and one active area AA is increased, a layout area ($8F^2$ in the example of FIG. 3) of the first bit line BL1 and the via contacts V2 does not change. Therefore, when the number of MTJ elements that share the two adjacent word lines WL and one active area AA is increased, the influence of the layout area of the first bit line BL1 and the via contacts V2 on the area of one MTJ element decreases. In the example of FIG. 3, when the number of MTJ elements that share the two adjacent word lines WL and one active area AA is increased infinitely, the area of one MTJ element converges to $8F^2$.

Furthermore, the active area AA in the MRAM according to the first embodiment is continuously formed in the column direction and is not separated into a plurality of areas by the element isolation regions STI. This facilitates forming the active area AA in the MRAM according to the first embodiment by the lithography and the etching.

In this way, the area of one memory cell MC is small and the high current sufficient to write data can be supplied to each MTJ element in the MRAM according to the first embodiment, and the MRAM according to the first embodiment can be manufactured more easily than the conventional MRAM.

The MTJ elements in the MRAM configured as described above are selectively driven as follows.

(Writing Operation)

For example, when data is written to an MTJ element MTJsel shown in FIG. 1, the write driver WD applies a write voltage Vwrite to the first bit line BL1 and a voltage Vout to a bit line BL2sel among the second bit lines BL2. Generally, a power supply voltage is used as the voltage Vwrite and a voltage of 0 V (GND) is used as the voltage Vout. Further, the word line driver WLD drives the word lines WL0 and WL1 present on the both sides of the MTJ element MTJsel, thereby making the cell transistors CT corresponding to the word lines WL0 and WL1 conductive. The cell transistors CT corresponding to the word lines WL0 and WL1 can thereby supply a current to the MTJ element MTJsel. In the first embodiment, the total gate width of the cell transistors CT is as large as 20F. Therefore, the cell transistors CT can supply a sufficiently high current to the MTJ element MTJsel.

Meanwhile, the write driver WD fixes voltages of the second bit lines BL2 other than the second bit line BL2*sel* to a predetermined voltage Vwmed that is between the write voltage Vwrite applied to the first bit line BL1 and the voltage Vout applied to the second bit line BL2*sel*. The voltage Vwmed is set so as to make voltage differences between the upper and lower ends of the MTJ elements other than the MTJ element MTJsel as close to zero as possible. This is intended to prevent data from being written to the unselected MTJ elements. Normally, the voltage Vwmed can be calculated in consideration of a resistance from the first bit line BL1 to the lower end of each MTJ element and that from the second bit line BL2 to the upper end of the MTJ element. Alternatively, the voltage Vwmed can be experimentally obtained using actual products. When no data is written to the unselected MTJ elements and no problem occurs even when the voltage Vwmed is an intermediate value (|Vwrite−Vout|/2) between the write voltage Vwrite and the voltage Vout, the intermediate value (|Vwrite−Vout|/2) can be used as the voltage Vwmed.

In this way, the MRAM according to the first embodiment enables one memory cell MCsel to be selected while the same word lines WL and the same active area AA are shared by the MTJ elements.

The selected MTJ element MTJsel is connected between the first bit line BL1 and the second bit line BL2*sel*, and a current flows to the MTJ element MTJsel by a voltage difference (|Vwrite−Vout|) between the first bit line BL1 and the second bit line BL2*sel*. This current allows data to be written to the selected MTJ element MTJsel.

In this way, the MRAM according to the first embodiment enables data to be selectively written to the MTJ element MTJsel. During the data writing operation described above, when data opposite to the write data is to be written, it suffices to make a voltage application direction opposite to the voltage application direction described above. That is, it suffices to apply the voltage Vwrite to the second bit line BL2*sel* and the voltage Vout to the first bit line BL1.

When data is written to the MTJ element MTJsel, the data can be written to the MTJ element MTJsel even when the unselected second bit lines BL2 are made in a floating state. However, in this case, the unselected second bit lines BL2 are also charged via the cell transistors CT. As a result, the speed of applying the voltage to the MTJ element MTJsel is delayed by as much as capacities of the unselected second bit lines BL2. Therefore, in consideration of an operating speed, the voltages of the unselected second bit lines BL2 are preferably fixed to the predetermined voltage Vwmed.

(Reading Operation)

For example, when data is read from the MTJ element MTJsel, the corresponding sense amplifier SA serving as a driver applies a read voltage Vread to the first bit line BL1. In addition, the corresponding word line driver WLD drives the word lines WL0 and WL1 on the both sides of the MTJ element MTJsel, thereby making the cell transistors CT corresponding to the word lines WL0 and WL1 conductive. The cell transistors CT corresponding to the word lines WL0 and WL1 can thereby supply a current to the MTJ element MTJsel.

The MTJ element MTJsel is connected between the first bit line BL1 and the second bit line BL2*sel*, and a current flows to the MTJ element MTJsel by a voltage difference (|Vread−Vout|) between the first bit line BL1 and the second bit line BL2*sel*. It suffices that the sense amplifier SA detects a current Icell flowing to the second bit line BL2*sel* connected to the selected MTJ element MTJsel. Generally, the power supply voltage is used as the voltage Vread and the voltage of 0 V (GND) is used as the voltage Vout.

At this time, the corresponding write driver WD fixes the voltages of the second bit lines BL2 other than the second bit line BL2*sel* to a predetermined voltage Vrmed that is between the read voltage Vread applied to the first bit line BL1 and the voltage Vout applied to the second bit line BL2*sel*. The voltage Vrmed is set so as to make voltage differences between the upper and lower ends of the MTJ elements other than the MTJ element MTJsel as close to zero as possible. This is intended to prevent data stored in the unselected MTJ elements from being disturbed during the data reading operation. The method of setting the voltage Vrmed is the same as that of setting the voltage Vwmed. When the data stored in the unselected MTJ elements is not disturbed and no problem occurs even when the voltage Vrmed is an intermediate value (|Vread−Vout|/2) between the read voltage Vread and the voltage Vout, the intermediate value (|Vread−Vout|/2) can be used as the voltage Vrmed.

When data is read from the MTJ element MTJsel, the data can be read from the MTJ element MTJsel even when the unselected second bit lines BL2 are made in a floating state. However, in this case, the unselected second bit lines BL2 are also charged via the cell transistors CT. As a result, the speed of applying the voltage to the MD element MTJsel is delayed by as much as the capacities of the unselected second bit lines BL2. Therefore, in consideration of an operating speed, the voltages of the unselected second bit lines BL2 are preferably fixed to the predetermined voltage Vrmed.

Second Embodiment

Figure 7:
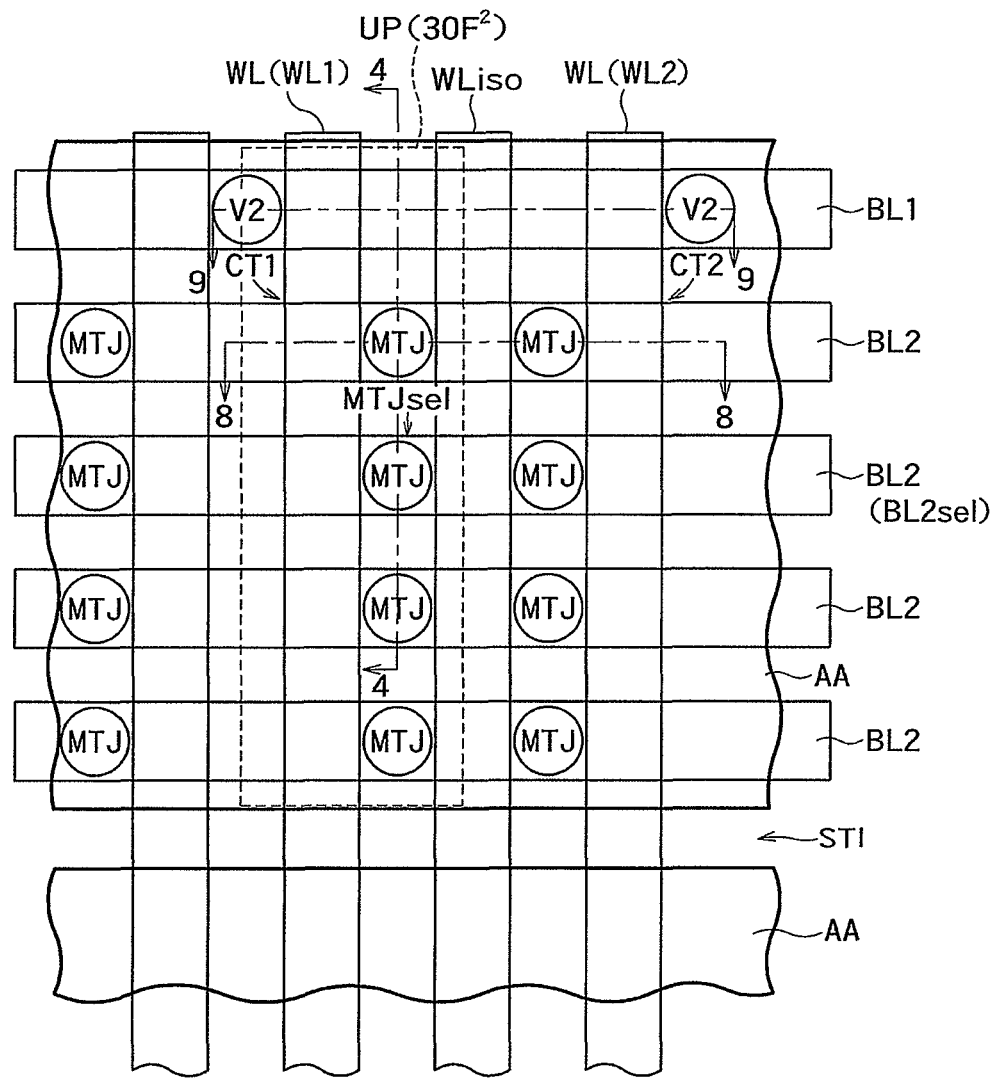
FIG. 7 is a partial plan layout view of each of the memory cell arrays MCA in an MRAM according to a second embodiment.
Figure 8:
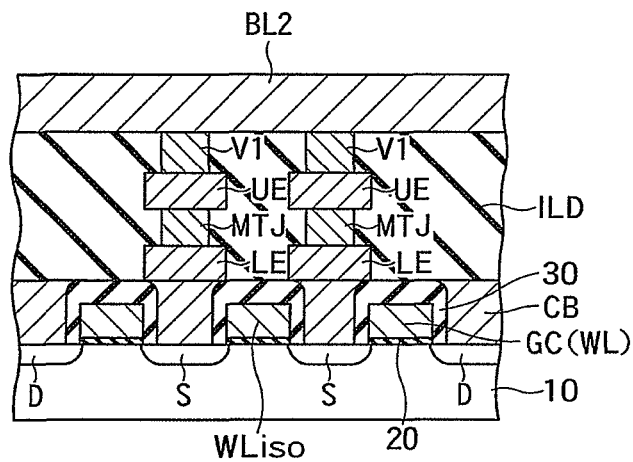
FIG. 8 is a cross-sectional view taken along a line 8-8 of FIG. 7.
Figure 9:
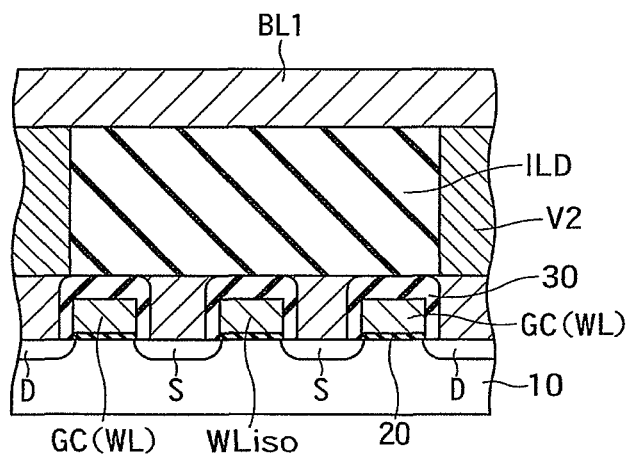
FIG. 9 is a cross-sectional view taken along a line 9-9 of FIG. 7.

FIG. 7 is a partial plan layout view of each of the memory cell arrays MCA in an MRAM according to a second embodiment. FIG. 8 is a cross-sectional view taken along a line 8-8 of FIG. 7. FIG. 9 is a cross-sectional view taken along a line 9-9 of FIG. 7. Note that a cross-sectional view taken along a line 4-4 of FIG. 7 is the same as that shown in FIG. 4.

In the second embodiment, the MRAM further includes an element-isolation word line WLiso provided between a plurality of MTJ elements adjacent in the column direction and constantly isolating the MTJ elements. Furthermore, a plurality of MTJ elements are arranged on each side of the element-isolation word line WLiso in the row direction. The MTJ elements share the word lines WL provided on one side of the MTJ elements, and the element-isolation word line WLiso and the active area AA provided on the other side of the MTJ elements.

The voltage of the element-isolation word line WLiso is fixed to 0 V, for example, and electrically isolates the MTJ elements present on the both sides of the element-isolation word line WLiso. Therefore, the MTJ elements on the both sides of the element-isolation word line WLiso can be controlled independently of one another. The element-isolation word line WLiso differs from other ordinary word lines WL only in the applied voltage and has the same configuration as that of the other ordinary word lines WL.

Other configurations of the second embodiment can be identical to corresponding ones of the first embodiment.

In this way, in the MRAM according to the second embodiment, the MTJ elements are provided on each side of the element-isolation word line WLiso. The MD elements on one side of the element-isolation word line WLiso are provided between the element-isolation word line WLiso and the first word line WL1, and share the first word line WL1 and the element-isolation word line WLiso. The MD elements on the other side of the element-isolation word line WLiso are provided between the element-isolation word line WLiso and the second word line WL2, and share the second word line WL2 and the element-isolation word line WLiso.

Cell transistors CT1 and CT2 corresponding to the two word lines WL1 and WL2 present on the both sides of one element-isolation word line WLiso are provided on the same active area AA. However, the element-isolation word line WLiso electrically isolates the cell transistor CT1 from the cell transistor CT2. Like the cell transistors CT according to the first embodiment, each of the cell transistors CT1 and CT2 has a large gate width. The gate width of each of the cell transistors CT1 and CT2 is substantially equal to the width Waa of the active area AA in the row direction. Therefore, the cell transistor CT1 can supply a sufficiently high current to one MTJ element selected from the MTJ elements provided between the word line WL1 and the cell transistor CT1. In addition, the cell transistor CT2 can supply a sufficiently high current to one MTJ element selected from the MTJ elements provided between the word line WL2 and the cell transistor CT2. However, one MTJ element is selected from the MTJ elements corresponding to the cell transistors CT1 and CT2 during the data writing operation or the data reading operation. This is because the MTJ elements corresponding to the cell transistor CT1 and those corresponding to the cell transistor CT2 share the second bit lines BL2.

An area of the unit pattern UP indicated by a broken line in FIG. 7 is $30F^2$. Because one unit pattern UP includes the four MTJ elements, an area of one MTJ element is $7.5F^2$. Furthermore, the gate width of each of the cell transistors CT1 and CT2 is equal to the width Waa of one active area AA in the row direction, that is, 10F.

Therefore, like the first embodiment, the area of one MTJ element (or one memory cell MC) in the MRAM according to the second embodiment can be reduced and the gate width of each of the cell transistors CT1 and CT2 per one MTJ element (or one memory cell MC) can be increased.

Accordingly, the second embodiment can also achieve effects identical to those of the first embodiment.

In the second embodiment, the number of MTJ elements between the word line WL1 and the cell transistor CT1 and that between the word line WL2 and the cell transistor CT2 are four. Alternatively, the numbers of MTJ elements can be increased. In this case, it suffices to increase the width Waa of the active area AA in the row direction. In this case, the influence of the layout area of the first bit line BL1 and the via contacts V2 on the area of one MTJ element decreases. In an example of FIG. 7, when the number of MTJ elements that share the word lines WL and one active area AA increases infinitely, the area of one MTJ element converges to $6F^2$.

The MTJ elements in the MRAM configured as described above are selectively driven as follows.

(Writing Operation)

For example, when data is written to the MTJ element MTJsel shown in FIG. 7, the corresponding write driver WD applies the write voltage Vwrite to the first bit line BL and the voltage Vout to the bit line BL2sel among the second bit lines BL2. In addition, the corresponding word line driver WLD drives the word line WL1 on one side of the MTJ element MTJsel, thereby making the cell transistor CT1 corresponding to the word line WL1 conductive. The cell transistor CT1 corresponding to the word line WL1 can thereby supply a current to the MTJ element MTJsel. Because the gate width of the cell transistor CT1 is as large as 10F, the cell transistor CT1 can supply a sufficiently high current to the MTJ element MTJsel.

The MTJ element MTJsel is connected between the first bit line BL1 and the second bit line BL2sel, and a current flows to the MTJ element MTJsel by the voltage difference (|Vwrite−Vout|) between the first bit line BL1 and the second bit line BL2sel. This current allows data to be written to the selected MTJ element MTJsel. Generally, the power supply voltage is used as the voltage Vwrite and the voltage of 0 V (GND) is used as the voltage Vout.

At this time, the voltage of the element-isolation word line WLiso is fixed to 0V, for example, and electrically isolates the MTJ elements on the both sides of the element-isolation word line WLiso.

On the other hand, the write driver WD fixes the voltages of the second bit lines BL2 other than the second bit line BL2sel to the predetermined voltage Vwmed. The voltage Vwmed is set as described above.

In this way, the MRAM according to the second embodiment enables data to be selectively written to the MTJ element MTJsel. When data having an opposite logic to that of the write data is to be written, it suffices to make a voltage application direction opposite to the voltage application direction described above.

(Reading Operation)

For example, when data is read from the MTJ element MTJsel, the corresponding sense amplifier SA serving as a driver applies the read voltage Vread to the first bit line BL1. In addition, the corresponding word line driver WLD drives the word line WL1 on one side of the MTJ element MTJsel, thereby making the cell transistor CT1 corresponding to the word line WL1 conductive. The cell transistor CT1 corresponding to the word line WL1 can thereby supply a current to the MTJ element MTJsel.

The MTJ element MTJsel is connected between the first bit line BL1 and the second bit line BL2sel, and a current flows to the MTJ element MTJsel by the voltage difference (|Vread−Vout|) between the first bit line BL1 and the second bit line BL2sel. It suffices that the sense amplifier SA detects the current Icell flowing to the second bit line BL2sel connected to the selected MTJ element MTJsel. Generally, the power supply voltage is used as the voltage Vread and the voltage of 0 V (GND) is used as the voltage Vout.

At this time, the write driver WD fixes the voltages of the second bit lines BL2 other than the second bit line BL2sel to the predetermined voltage Vrmed. The voltage Vrmed is set as described above.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a semiconductor substrate;
an active area on the semiconductor substrate;
cell transistors on the active area;
magnetic tunnel junction elements respectively having a first end electrically connected to any one of a source and a drain of one of the cell transistors;

first bit lines each electrically connected to the other one of the source and the drain of one of the cell transistors;

second bit lines each electrically connected to a second end of one of the magnetic tunnel junction elements; and word lines each electrically connected to a gate of one of the cell transistors or functioning as a gate of one of the cell transistors, wherein a plurality of the second bit lines correspond to one of the first bit lines, a plurality of the magnetic tunnel junction elements share the same word line and the same active area, and the active area is continuously formed in an extending direction of the first and second bit lines.

2. The device of claim 1, wherein the cell transistor connected to the first ends of the magnetic tunnel junction elements sharing the word line and the active area is shared by the magnetic tunnel junction elements.

3. The device of claim 1, wherein a plurality of the magnetic tunnel junction elements share two of the word lines provided on both sides of the magnetic tunnel junction elements.

4. The device of claim 2, wherein a plurality of the magnetic tunnel junction elements share two of the word lines provided on both sides of the magnetic tunnel junction elements.

5. The device of claim 3, wherein a plurality of the cell transistors corresponding to the two word lines provided on both sides of the plurality of the magnetic tunnel junction elements supply a current to a magnetic tunnel junction element selected from the plurality of the magnetic tunnel junction elements.

6. The device of claim 4, wherein a plurality of the cell transistors corresponding to the two word lines provided on both sides of the plurality of the magnetic tunnel junction elements supply a current to a magnetic tunnel junction element selected from the plurality of the magnetic tunnel junction elements.

7. The device of claim 1, further comprising an element-isolation word line provided between the two magnetic tunnel junction elements adjacent in an extending direction of the first and second bit lines, and isolating the two magnetic tunnel junction elements from each other, wherein a plurality of magnetic tunnel junction elements are provided on both sides of the element-isolation word line, respectively, and the plurality of the magnetic tunnel junction elements on one side of the element-isolation word line share the word line, the element-isolation word line and the active area.

8. The device of claim 2, further comprising an element-isolation word line provided between the two magnetic tunnel junction elements adjacent in an extending direction of the first and second bit lines, and isolating the two magnetic tunnel junction elements from each other, wherein a plurality of magnetic tunnel junction elements are provided on both sides of the element-isolation word line, respectively, and the plurality of the magnetic tunnel junction elements on one side of the element-isolation word line share the word line, the element-isolation word line and the active area.

9. The device of claim 7, wherein the plurality of the magnetic tunnel junction elements on the other side of the element-isolation word line share the word line, the element-isolation word line and the active area.

10. The device of claim 8, wherein the plurality of the magnetic tunnel junction elements on the other side of the element-isolation word line share the word line, the element-isolation word line and the active area.

11. The device of claim 1, further comprising a write driver fixing voltages of the second bit lines other than the second bit line connected to one selected magnetic tunnel junction element to a predetermined voltage when the one magnetic tunnel junction element is selected from the magnetic tunnel junction elements sharing the word line and the active area.

12. The device of claim 2, further comprising a write driver fixing voltages of the second bit lines other than the second bit line connected to one selected magnetic tunnel junction element to a predetermined voltage when the one magnetic tunnel junction element is selected from the magnetic tunnel junction elements sharing the word line and the active area.

13. The device of claim 3, further comprising a write driver fixing voltages of the second bit lines other than the second bit line connected to one selected magnetic tunnel junction element to a predetermined voltage when the one magnetic tunnel junction element is selected from the magnetic tunnel junction elements sharing the word line and the active area.

14. The device of claim 4, further comprising a write driver fixing voltages of the second bit lines other than the second bit line connected to one selected magnetic tunnel junction element to a predetermined voltage when the one magnetic tunnel junction element is selected from the magnetic tunnel junction elements sharing the word line and the active area.

15. The device of claim 7, further comprising a write driver fixing voltages of the second bit line other than the second bit line connected to one selected magnetic tunnel junction element to a predetermined voltage when the one magnetic tunnel junction element is selected from the magnetic tunnel junction elements sharing the word line, the element-isolation word line, and the active area.

16. The device of claim 8, further comprising a write driver fixing voltages of the second bit line other than the second bit line connected to one selected magnetic tunnel junction element to a predetermined voltage when the one magnetic tunnel junction element is selected from the magnetic tunnel junction elements sharing the word line, the element-isolation word line, and the active area.

17. The device of claim 9, further comprising a write driver fixing voltages of the second bit line other than the second bit line connected to one selected magnetic tunnel junction element to a predetermined voltage when the one magnetic tunnel junction element is selected from the magnetic tunnel junction elements sharing the word line, the element-isolation word line, and the active area.

18. The device of claim 10, further comprising a write driver fixing voltages of the second bit line other than the second bit line connected to one selected magnetic tunnel junction element to a predetermined voltage when the one magnetic tunnel junction element is selected from the magnetic tunnel junction elements sharing the word line, the element-isolation word line, and the active area.

* * * * *